United States Patent [19]
Nguyen

[11] Patent Number: 5,357,216
[45] Date of Patent: Oct. 18, 1994

[54] CURRENT SOURCING AND SINKING CIRCUIT FOR DRIVING A VCO CHARGE PUMP

[75] Inventor: Thai M. Nguyen, Santa Clara, Calif.

[73] Assignee: National Semiconductor Corporation, Santa Clara, Calif.

[21] Appl. No.: 3,928

[22] Filed: Jan. 13, 1993

[51] Int. Cl.⁵ ..................... H03L 7/089; H03L 7/093
[52] U.S. Cl. .................... 331/25; 331/1 A; 331/8; 331/17
[58] Field of Search .................. 331/8, 17, 25, 1 A

[56] References Cited

U.S. PATENT DOCUMENTS

| | | | |
|---|---|---|---|
| 4,745,372 | 5/1988 | Miwa | 331/8 |
| 5,164,889 | 11/1992 | Ruetz | 363/60 |
| 5,220,294 | 6/1993 | Ichikawa | 331/17 |
| 5,233,314 | 8/1993 | McDermott et al. | 331/17 |

FOREIGN PATENT DOCUMENTS

0054322A1  6/1982  European Pat. Off. .
0238041A2  9/1987  European Pat. Off. .

Primary Examiner—David Mis
Attorney, Agent, or Firm—Limbach & Limbach

[57] ABSTRACT

A current sourcing and sinking circuit for driving a charge pump for a voltage-controlled oscillator includes two similar subcircuits, each of which is capable of simultaneously sourcing and sinking output currents. Both subcircuits have identical, corresponding CMOS-FET components with two open drain outputs, one of which is a current sourcing output port and the other of which is a current sinking output port. In one subcircuit the current sourcing output port is used while the current sinking output port is terminated drain-to-source with a short circuit. In the other subcircuit the current sinking output port is used while the current sourcing output port is terminated drain-to-source with a short circuit. The similarity of the two subcircuits provides a balanced current sourcing and sinking circuit topology, resulting in substantially equal source and sink current amplitudes and current sourcing and sinking activation timing.

18 Claims, 13 Drawing Sheets

CURRENT SOURCING AND SINKING CIRCUIT FOR DRIVING A VCO CHARGE PUMP

FIELD OF THE INVENTION

This invention relates to a charge pump circuit and more particularly, to a charge pump having substantially equal current source and sink capabilities with the charge pump output potential being varied from a given voltage supply potential to ground, utilizing little static power, and being substantially insensitive to variations in the voltage supply to output current.

BACKGROUND OF THE INVENTION

Charge pump circuits are normally employed in phase locked loop circuits and selectively provide current to a loop filter or receive current from the filter. Such current generation and reception causes a voltage controlled oscillator to produce an output signal having a desired frequency.

Specifically, charge pump circuits receive an error signal corresponding to a phase difference between a reference signal and the output signal. The error signal specifies frequency modifications necessary to make the frequency of the output signal substantially identical to the reference signal frequency.

If the output frequency is to be increased, the charge pump circuit selectively sources or increases the amount of current generated to the loop filter. Alternatively, if the frequency is to be decreased, the charge pump sinks or receives a certain amount of current from the loop filter. In many instances, current is both sourced and sunk in order to make desired frequency modifications. Such current sourcing and sinking respectively increases and decreases the potential or voltage of the loop filter which is applied to the voltage controlled oscillator. These voltage modifications cause the oscillator to vary the frequency of the output signal in the desired manner.

While many conventional charge pump circuits adequately and desirably modify the output signal frequency, they also suffer from many drawbacks. For example, it is not uncommon for a given charge pump to have non-identical current generating and sinking circuits and to therefore generate and absorb non-identical amounts of current. Such disparity causes these charge pumps to incorrectly modify the output signal frequency.

Moreover, these unique current generating and sinking circuits usually have unequal activation time intervals with respect to the time at which a correction signal was received. Such activation disparity increases the time necessary to produce an output signal having a desired frequency and increases phase noise and spurious frequency generation. Many conventional charge pump circuits also utilize elements which consume relatively large amounts of power and have current amplitudes which vary in proportion to variations in one or more voltage supplies. This further adds to the overall unreliability of these devices.

To understand prior charge pump operation reference is now made to FIG. 1, where there is shown a phase correction signal generator 10 made in accordance with the teachings of the prior art. As shown, generator 10 includes a typical loop filter 25 which is connected to a voltage controlled oscillator 41. Generator 10 also includes a phase comparator 12 which receives a reference signal 14 and the output signal 16 generated by the voltage controlled oscillator 41. Comparator 12 compares the phase of signal 14 with the phase of signal 16 and, in response thereto, outputs frequency correction signals 20 and 22.

Signals 20 and 22 are input to charge pump circuit 24 and are respectively effective, when they are in a first logical state (i.e. logically high), to cause pump 24 to absorb or sink current from filter 25 and to cause pump 24 to output or source current to filter 25. When current is concomitantly sourced and sunk, signal 18 is generated by charge pump 24 and causes signals 20 and 22 to be of a second and opposite logical state (i.e. logically low), thereby preventing further current sinking or sourcing.

To illustrate some of the previously-described difficulties associated with prior charge pump circuits, reference is now made to FIG. 2 where there is shown a charge pump circuit 24' made in accordance with the teachings of the prior art. As shown, circuit 24' includes a cascaded arrangement of inverters 26, 28, and 30 which cooperatively receive and invert signal 22 and apply the inverted signal to the gate of a typical PMOS field effect transistor 33.

Circuit 24' further includes a second cascaded arrangement of inverters 31 and 32 which receive signal 20 and apply signal 20 to the gate of NMOS transistor 34. The respective source terminals of transistors 32 and 34 are coupled to a voltage source 36 and to electrical ground 38. Transistors 32 and 34 are mutually coupled at their respective drain terminals. These coupled drain terminals provide the output signal 40' which is coupled to the loop filter.

In operation, as will be known to those of ordinary skill in the art, signal 22, when logically high, activates transistor 33. Such transistor activation causes current to flow from the voltage source 36 through tile drain of transistor 33 and onto bus 40'. Signal 20, when logically high, activates transistor 34. Such transistor activation provides a current path from bus 40' to electrical ground 38. Concomitant deactivation of transistors 33 and 34 (i.e. when signals 20 and 22 are each logically low) places bus 40' in a tri or high impedance state and prevents current from either sourced or sunk.

As will be appreciated, inverters 26, 28, and 32 cooperate with transistor 33 to selectively generate current to bus 40' while inverters 30 and 32 cooperate with transistor 34 to provide a "current sink" circuit. Since these circuits are dissimilar (i.e. each having a different number of circuit elements 26, 28, 30 and 31, 32), they activate respective transistors 33 and 34 at different time intervals after receipt of respective signals 22, 20. These different activation time intervals are caused by the cumulative delay differences between the respective first phase comparator output signal reception element (i.e. 26 or 30) and the respective target transistor (i.e. 33 or 34). These delay disparities result in many of the previously-discussed difficulties.

Moreover, since transistors 33 and 34 are normally operated in a low impedance output state it is difficult, due to transistor fabrication constraints, to match such dissimilar N-type and P-type transistors. Such matching difficulties in combination with variations in the current output from the voltage source causes unequal current source and sink amplitudes. It should be apparent to those of ordinary skill in the art that such amplitude differences will degrade charge pump performance.

Referring now to FIG. 3, there is shown a second prior art charge pump circuit 24" which differs from circuit 24' by the use of bipolar transistors 35 and 37 and respective biasing resistors 39, 41, 42, and 43 in place of transistors 33 and 34. Specifically, resistors 42 and 43 are respectively coupled to the base and emitter of transistors 35 and 37. Resistors 41 and 39 are respectively coupled to inverters 30' and 32' and to resistors 42 and 43.

The operation of circuit 24" is substantially similar to that of circuit 24' in that logically high signals 22 and 20 respectively cause current to flow from the collector of transistors 35 and 37, thereby selectively sourcing and sinking current. When signals 22 and 20 are logically low, resistor pairs 41, 42 and 39, 43 respectively provide a path which applies the potential of source 36' to the base of transistor 35 and discharges current from the base of transistor 37 to ground, thereby preventing substantially any current from being sourced or sunk.

While circuit 24" adequately and selectively sources and sinks current it suffers from the same drawbacks as previously described with respect to circuit 24'. Moreover, it should be appreciated that circuits 24' and 24" have been described without reference to the manner in which signal 18 (shown and previously described with reference to FIG. 1) is generated. Such description is not necessary to adequately illustrate the various deficiencies associated with these prior charge pump circuits.

Therefore, there is a need to provide a charge pump circuit having substantially identical source and sink current amplitudes, substantially identical source and sink activation time intervals, relatively low static power utilization, and having currents that are relatively insensitive to variations in voltage supply output current.

SUMMARY OF THE INVENTION

A charge pump circuit is provided for use in combination with a loop filter and a voltage controlled oscillator which outputs a signal of a certain frequency. The charge pump includes a first circuit which selectively outputs current to the loop filter. The circuit further includes a second circuit having circuit elements which are each identical to one of the circuit elements of the first circuit and which selectively receives current from the loop filter.

These and other features, objects, and advantages of the present invention will be apparent from a reading of the following detailed description of the preferred embodiment and by reference to the claims taken in combination with the accompanying drawings.

DESCRIPTION OF THE PREFERRED EMBODIMENT

Figure 4:
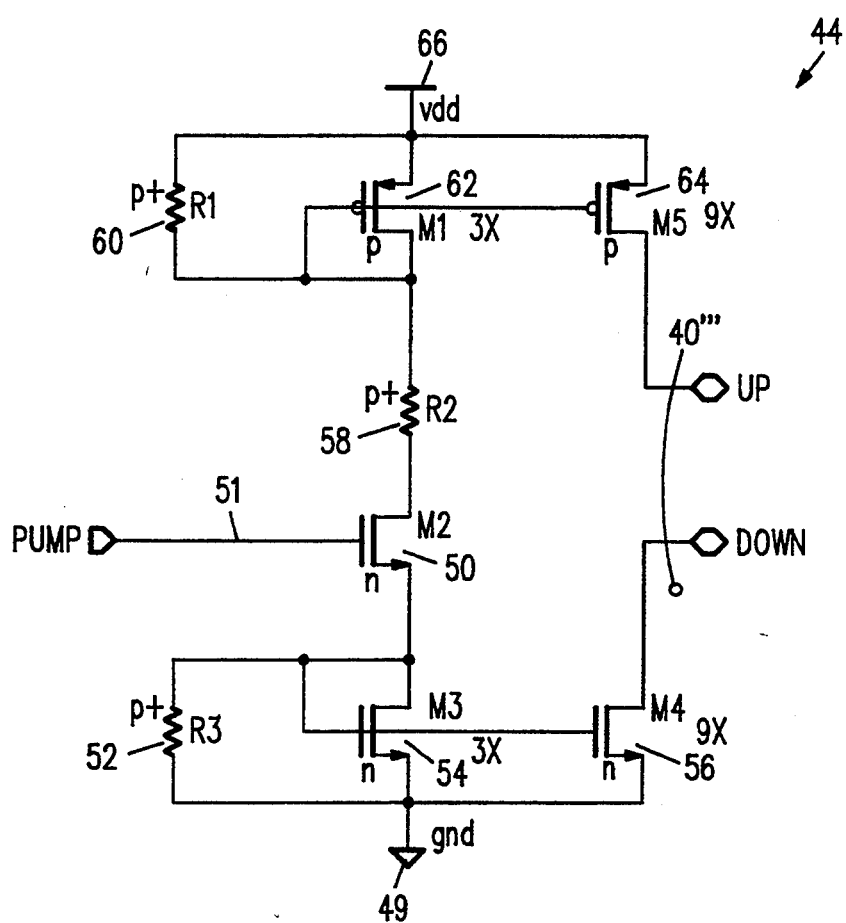
FIG. 4 is an electrical schematic diagram of a circuit made in accordance with the teachings of a first embodiment of this invention and adapted for use within a charge pump circuit.

Referring now to FIG. 4, there is shown a circuit 44 made in accordance with the teachings of a first embodiment of this invention and which alleviates many of the difficulties of prior art charge pumps. As shown, circuit 44 includes an NMOS transistor 50 having its gate terminal coupled to a pump control signal 51 and having its source terminal coupled to resistor 52, to the drain and gate terminals of NMOS transistor 54, and to the gate terminal of NMOS transistor 56.

Transistor 50 has its drain terminal coupled through resistor 58 to resistor 60, to the drain and gate terminals of PMOS transistor 62, and to the gate terminal of PMOS transistor 64. Resistor 60 and transistors 62 and 64 are each coupled to voltage supply source 66 while transistors 54 and 56 and resistor 52 are coupled to electrical ground 49.

Figure 1:
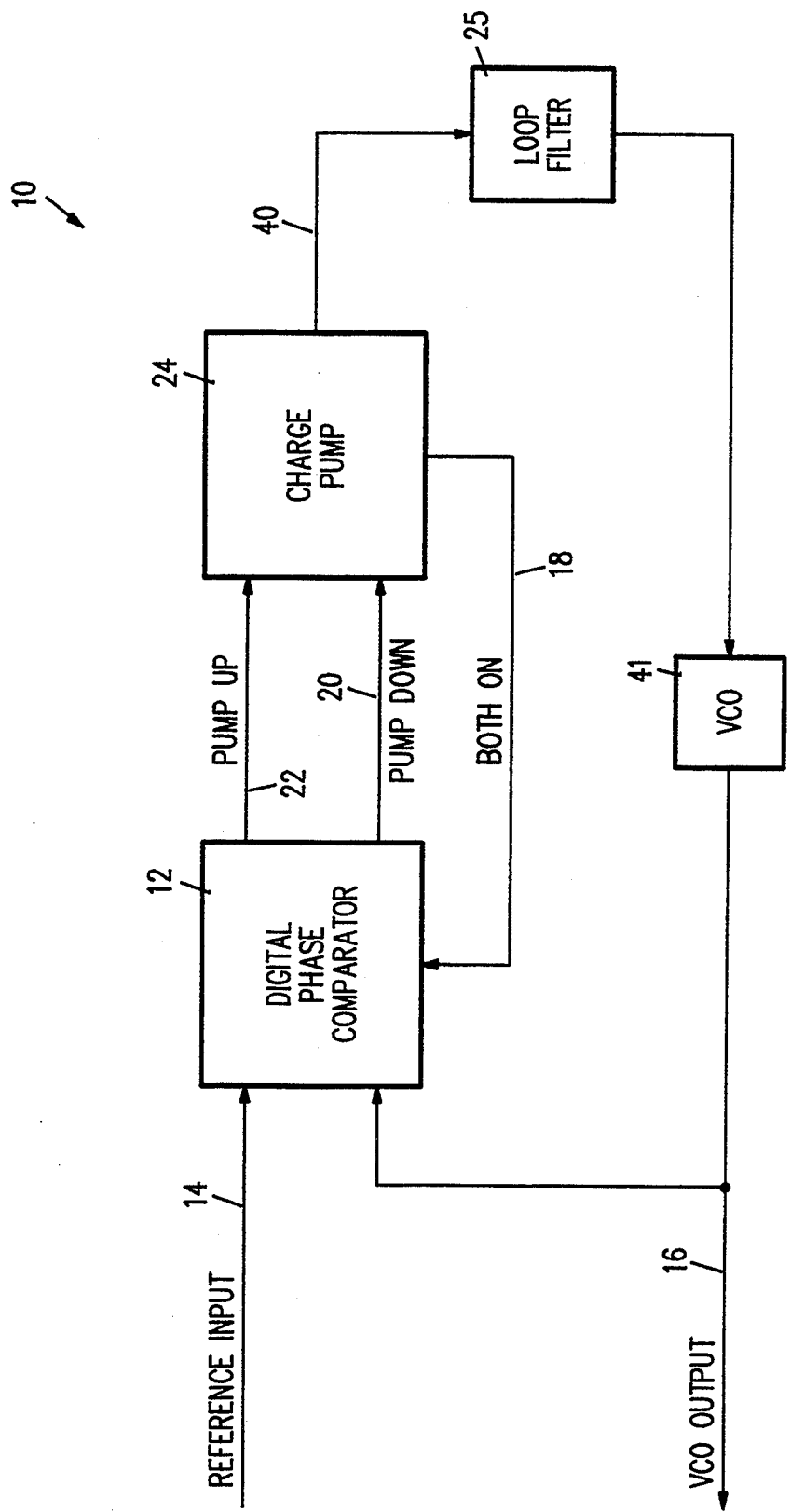
FIG. 1 is a block diagram of a correction signal generator made in accordance with the teachings of a preferred embodiment of this invention.
Figure 2:
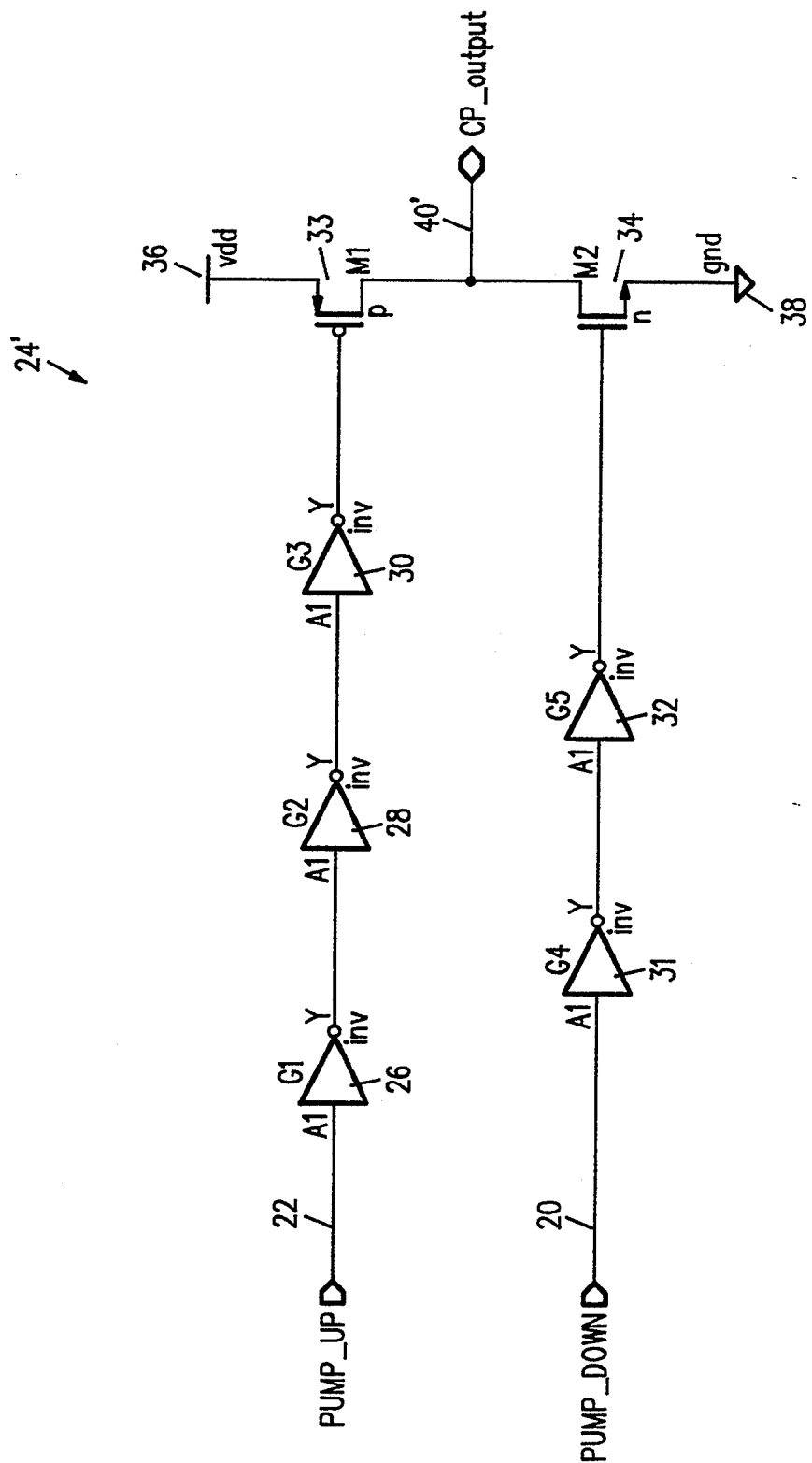
FIG. 2 is an electrical schematic diagram of a first charge pump circuit made in accordance with the teachings of the prior art.
Figure 3:
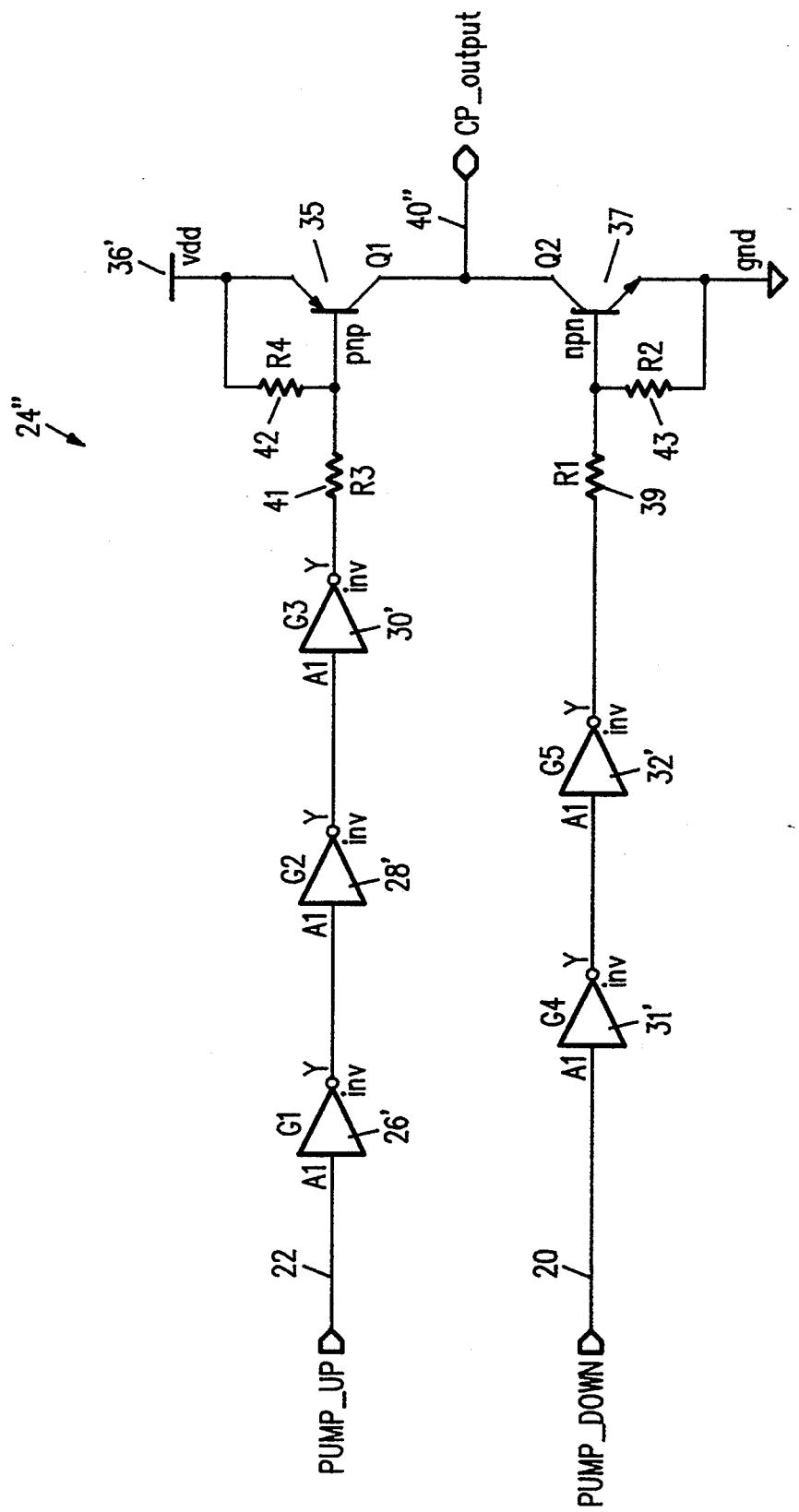
FIG. 3 is an electrical schematic diagram of a second charge pump circuit made in accordance with the teachings of the prior art.

Circuit 44 may be selectively configured as a current source or a current sink. Therefore, signal 51 may selectively be similar to signal 20 or 22 depending upon the type of circuit configuration desired. In current source operation, as shown by circuit 44' FIG. 5(A), the drain terminal of transistor 56 is coupled to electrical ground 49 and the drain terminal of transistor 64 is coupled to output bus 40'''. Bus 40''' is coupled to a conventional loop filter such as that shown and described with reference to FIG. 1. In current sink operation, as shown by circuit 44" in FIG. 5(B), the drain terminal of transistor 64 is coupled to source 66 while the drain terminal of transistor 56 is coupled to bus 40'''.

In operation, a logically high pump control signal activates transistor 50. Such transistor activation causes current to flow from source 66 through resistors 52 and 60 and through transistors 54 and 62. In the preferred embodiment of circuit 44, resistors 52 and 60 and transistors 62 and 54 are chosen such that the amount of current flowing through resistors 52 and 60 is substantially similar. The amount of current flowing through transistors 54 and 62 is also made to be substantially similar. In this manner, as should be apparent to one of ordinary skill in the art, the amounts of current output from transistor 64 and sunk by transistor 56 are substantially equal. Moreover, it should be realized that transistors 64 and 56 may be scaled as desired relative to transistors 62 and 54 in order to source or sink various amounts of current.

Figure 5A:
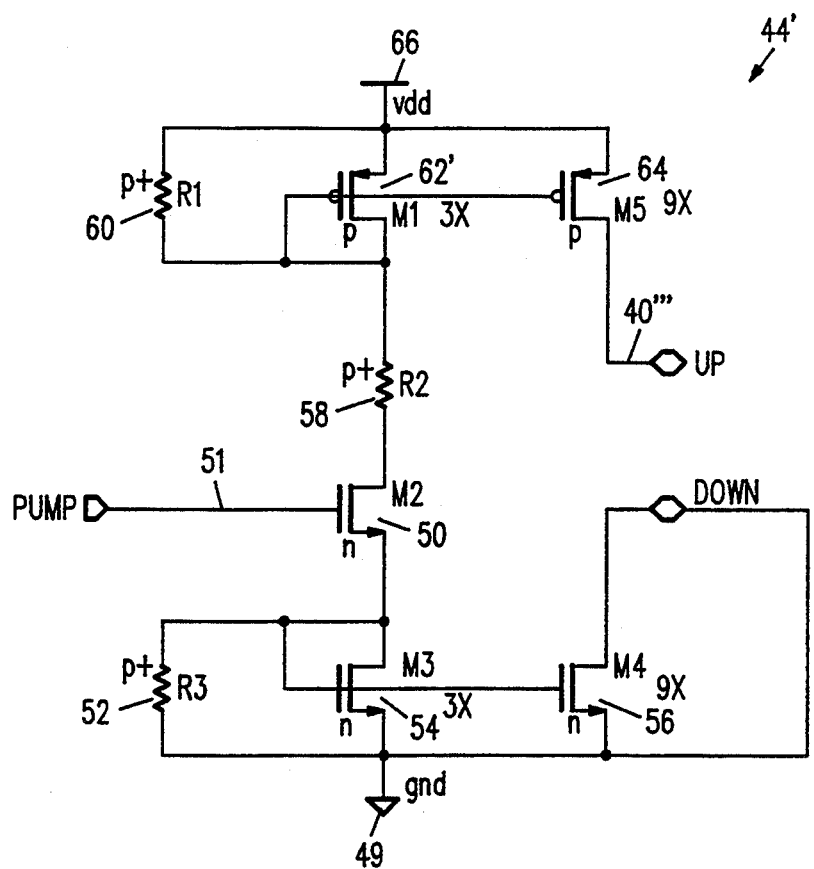
FIGS. 5(A-B) are electrical schematic diagrams respectively illustrating the circuit of FIG. 4 in a current source and current sink configuration.
Figure 5B:
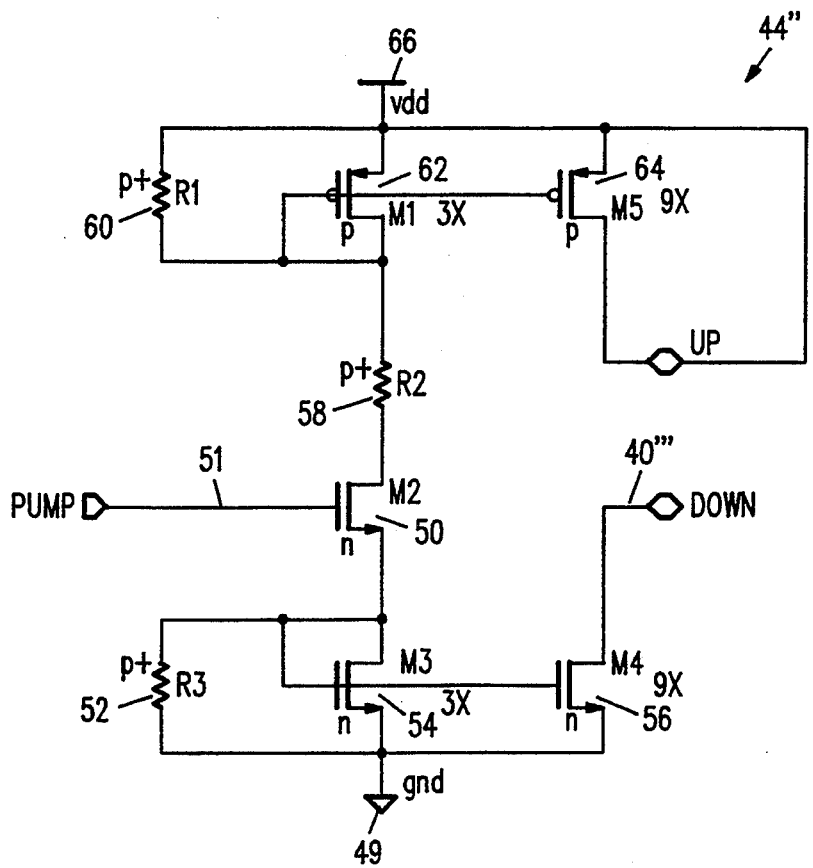

In current source operation (see FIG. 5(A)), the current which is output from transistor 64 is placed onto bus 40''' and input to a conventional loop filter in the previously described manner. In current sink configuration (see FIG. 5(B)), the drain terminal of transistor 56 draws an amount of current from the loop filter which is substantially equal to the amount of current provided by transistor 64 in the source configuration. In this manner, substantially identical amounts of source and sink currents are provided.

When signal 51 becomes logically low, transistor 50 becomes deactivated and resistor 52 discharges the voltage potential respectively existing between the gate and drain terminals of transistor 54 and at the gate terminal of transistor 56. Such discharge is made to ground 49. In this manner, transistors 54 and 56 become deactivated and no current is absorbed or sunk. Moreover, logically low signal 51 also causes resistor 60 to apply voltage from source 66 across the respective drain and gate terminal of transistors 62 and 64, thereby preventing current from being output or sourced onto bus 40'''.

As should be apparent to one of ordinary skill in the art, circuit 44 may be easily adapted to selectively provide or sink equal amounts of current. Moreover, it should be further apparent that a charge pump circuit 30 may be constructed having two substantially identical source and sink circuits 44' and 44''. Each circuit 44' and 44'' having identical circuit elements 50, 52, 54, 56, 58, 60, 62, 64, and 66 and sinking or sourcing current at a substantially similar time after receipt of signal 51. Use of NMOS and PMOS elements 50, 54, 56, 62, and 64 minimize static power consumption.

While circuit 44 performs well, it has some disadvantages. For example, its output current depends upon the resistance of resistors 52, 58, and 60. It is difficult to reliably manufacture resistors having substantially identical resistance values. It is therefore difficult to produce a quantity of circuits 44, each having consistently identical source output current levels. As a further drawback, the output current of circuit 44 varies in proportion to variations in the current produced by source 66. Commonly encountered voltage drift therefore undesirably changes output current levels.

Figure 6:
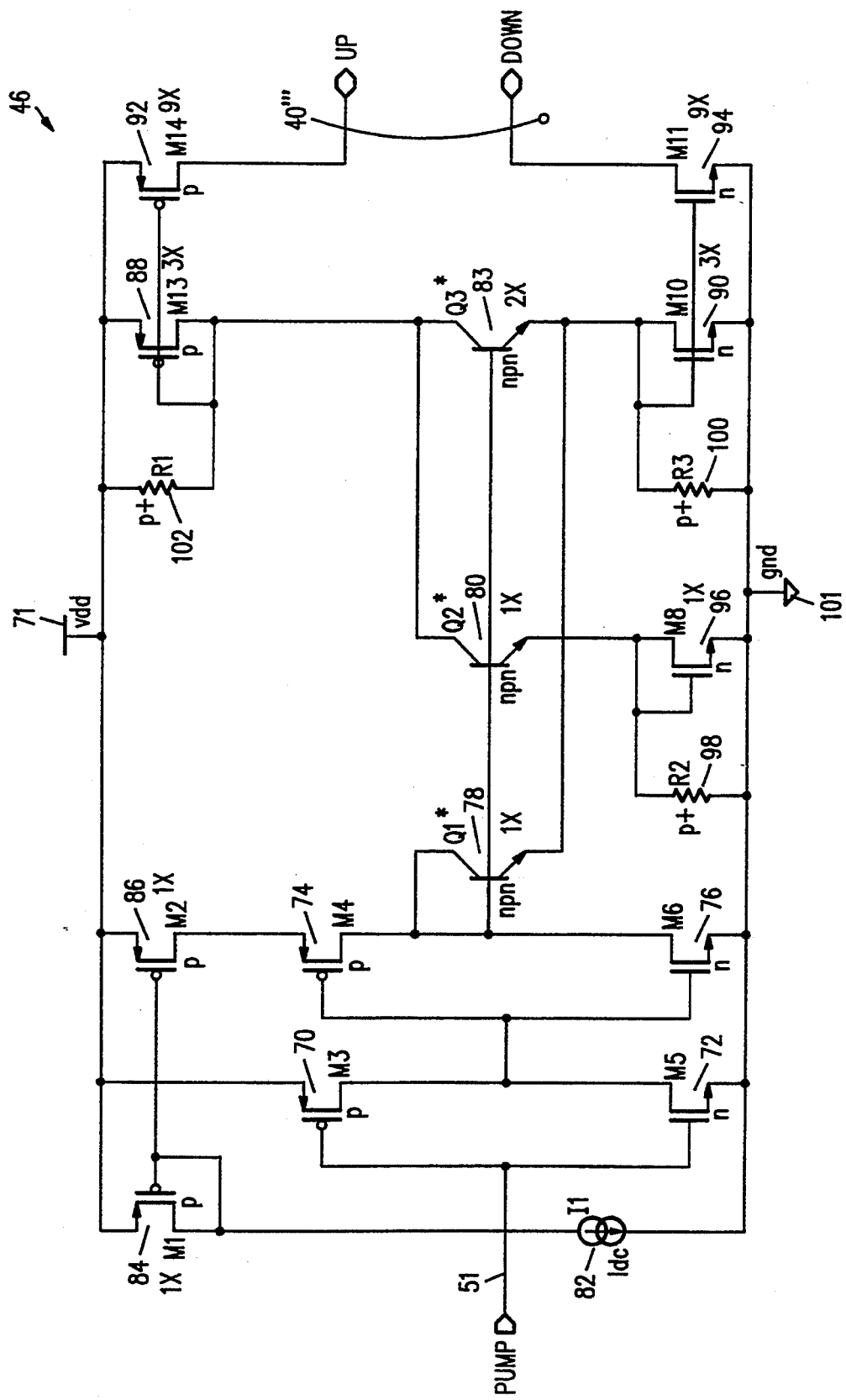
FIG. 6 is an electrical schematic diagram of a circuit made in accordance with the teachings of a second embodiment of this invention and adapted for use within a charge pump circuit.

Referring now to FIG. 6, there is shown a circuit 46 made in accordance with the teachings of a second embodiment of this invention. Circuit 46 is adapted for use in circuit 24 and is further adapted to alleviate many of the difficulties associated with circuit 44.

As shown, circuit 46 includes a PMOS transistor 70 and a NMOS transistor 72 having pump control signal 51 selectively applied to their respective gate terminals. Transistor 70 has its source terminal coupled to the source terminal of PMOS transistor 84, to the source terminal of PMOS transistor 86, to a voltage supply 71, to resistor 102, and to the respective source terminals of PMOS transistors 88 and 92.

Moreover, transistor 70 has its drain terminal coupled to the respective gate terminals of PMOS transistor 74 and NMOS transistor 76, and to the drain terminal of transistor 72. The source terminal of transistor 72 is coupled to a current source 82, to resistors 98 and 100, and to the respective source terminals of NMOS transistors 76, 90, 94, and 96. Source 82 is further coupled to the drain terminal of transistor 84 and to the gate terminal of transistor 86.

The drain terminal of transistor 74 is coupled to base and collector terminals of NPN bipolar transistor 78 and to the drain terminal of transistor 76. The base terminal of transistor 78 is coupled to the respective base terminals of NPN bipolar transistors 80 and 83, while the emitter terminal of transistor 78 is coupled to the emitter terminal of transistor 83. The emitter terminals of transistors 80 and 83 are respectively coupled to the drain terminals of transistors 96 and 90. Moreover, the emitter terminal of transistor 80 is further coupled to ground through resistor 98. The collector terminals of transistors 80 and 83 are mutually coupled to the drain and gate terminal of transistor 88 and to resistor 102. Resistors 98, 100 and the source terminals of transistors 72, 76, 90, 94, and 96 are coupled to electrical ground 101.

The gate terminals of transistors 90 and 88 are respectively coupled to the gate terminals of NMOS transistor 94 and of PMOS transistor 92. The drain terminal of transistors 92 and 94 are respectively coupled to output bus 40''', which is coupled to a conventional loop filter such as that shown and described with respect to FIG. 1.

Figure 7A:
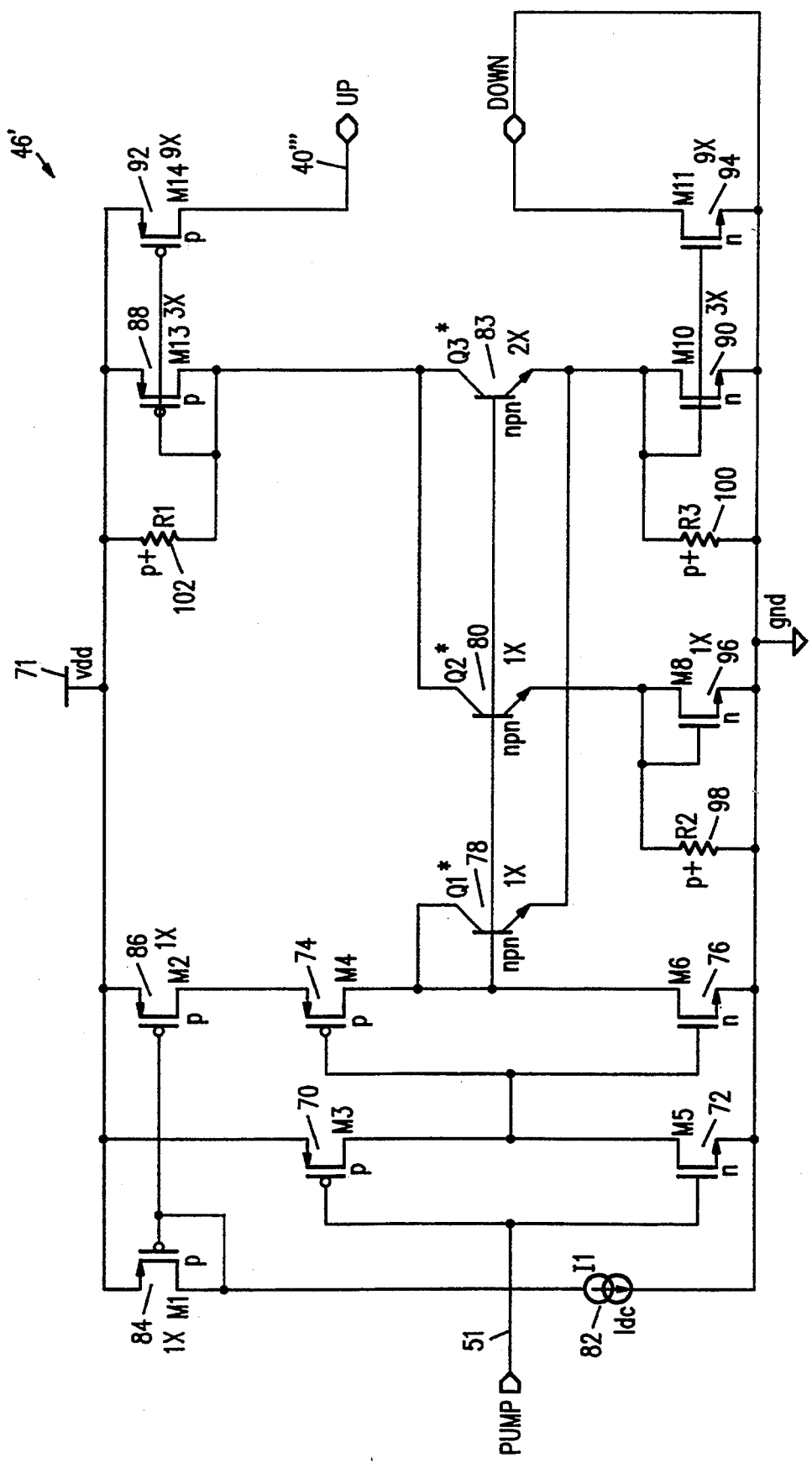
FIGS. 7(A-B) are electrical schematic diagrams respectively illustrating the circuit of FIG. 6 in a current source and current sink configuration.

In current source configuration (shown by circuit 46' in FIG. 7(A)), the drain terminal of transistor 94 is coupled to electrical ground 101 while the drain terminal of transistor 92 is coupled to bus 40'''. In current sink configuration (shown by circuit 46'' in FIG. 7(B)), the drain terminal of transistor 94 is coupled to bus 40''' while the drain terminal of transistor 92 is coupled to source 71.

A logically high pump control signal 51 activates transistor 72 and deactivates transistor 70, thereby activating transistor 74 and deactivating transistor 76. In this manner, current from source 82 flows through transistor 84 and forces the potential between the gate and drain terminals of transistor 84 to be substantially equal to the potential applied to the gate terminal of transistor 86, thereby causing transistors 84 and 86 to form a current mirror. Therefore, the amount of current flowing through transistor 74 will be substantially similar to the amount of current flowing through transistor 86.

Current flowing through transistor 74 will be coupled to transistor 78, thereby activating transistors 80 and 83. In the preferred embodiment of circuit 46, transistors 78 and 80 provide unitary current amplification while transistor 83 doubles the current which it receives. Current output from transistor 80 flows through resistor 98 and transistor 96. Moreover, since the collector terminals of transistors 80 and 83 are mutually coupled to resistor 102 and to the drain and gate terminal of transistor 88, approximately three times the amount of current received by transistor 80 is imparted to resistor 102 and transistor 88. It should be realized by one of ordinary skill in the art that the amplification factors associated with transistors 78, 80, and 83 may be varied as desired.

Since the emitter terminals of transistors 78 and 83 are mutually coupled to resistor 100 and transistor 90, approximately three times the amount of current received by transistor 78 is imparted to resistor 100 and transistor 90. In the preferred embodiment of this circuit, resistors 100 and 102, are chosen such that substantially equal amounts of current flow through them upon receipt of logically high signal 51. Moreover, transistors 92 and 94 are chosen such that substantially equal amounts of current flow through them upon receipt of a logically high signal 51.

Therefore, in current source configuration the current flowing through transistor 92 is placed onto bus 40''' and sourced to a conventional loop filter. In current sink configuration an amount of current substantially equal to that which is sourced from transistor 92 is received by transistor 94 through bus 40'''. In this manner, substantially identical amounts of current are selectively sourced and sunk to and from a conventional loop filter.

A logically low signal 51 deactivates transistor 72 and activates transistor 70, thereby causing the deactivation of transistor 74 and the activation of transistor 76. The activation of transistor 76 causes the collector terminals of transistor 78 and the base terminals of transistors 78, 80, and 83 to be coupled to ground 101. In this manner, current is prevented from flowing from source 71. Therefore, resistor 102 causes the drain to gate terminal potential of transistors 88 and 92 to be charged to a value approximately equal to the amount of potential provided by source 71. In this manner, transistors 88 and 92 are deactivated and current is not sourced.

Resistor 98 discharges the potential existing between the drain and gate terminals of transistor 96 to ground 101 upon activation of transistor 76. Similarly, resistor 100 discharges the potential existing between the respective drain and gate terminals of transistors 90 and 94. Such potential discharging deactivates transistors 90 and 94 and prevents current from being absorbed or sunk.

In the preferred current source configuration, each transistor 84, 86, 88, 90, 92, 94, and 96 is operated in its respective saturation region in order to prevent current source drift in response to a drift in power supply 71. Unitary scaling of the PMOS elements relative to the NMOS elements is preferred in order to substantially ensure all element activation times remain substantially identical. Moreover, it should be realized that transistors 92 and 94 may be scaled, as desired, relative to transistors 88 and 90 in order to source or sink various amounts of current.

It should be realized by one of ordinary skill in the art that two circuits 46' and 46" may be included within charge pump 24, each respectively and uniquely adapted to selectively output or sink current in the manner previously described. Accordingly, charge pump 24 may comprise two circuits each having identical circuit elements 70-102 but configured in different and complementary modes. It should also be realized that circuit amplication may be adjusted to provide desired current output or absorption amplitudes. Use of such identical circuit MOS elements in the manner described provides substantially identical complementary amplitudes, activation time intervals, lower power consumption, and substantial insensitivity to power supply drift.

Figure 8:
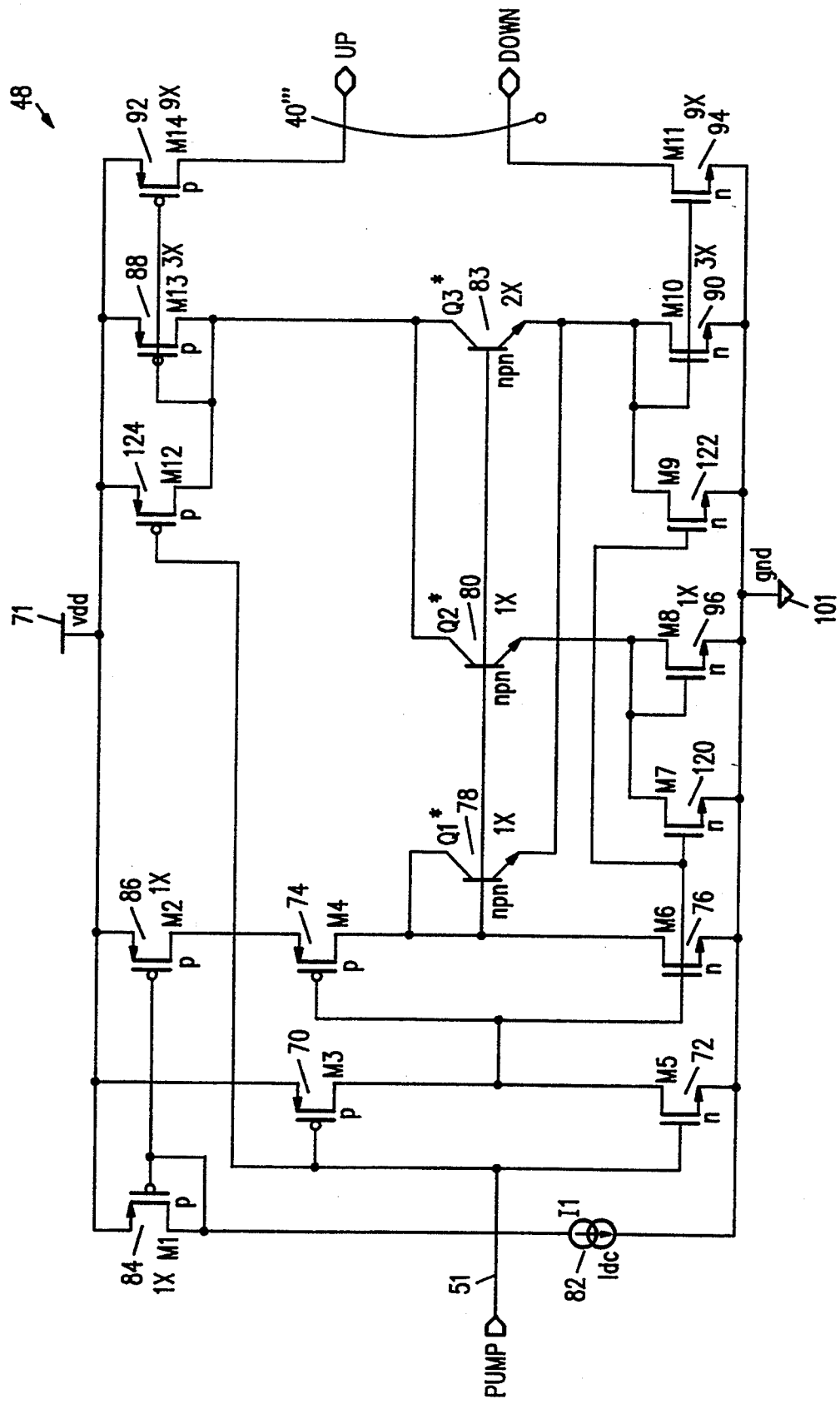
FIG. 8 is an electrical schematic diagram of a circuit made in accordance with the teachings of a third embodiment of this invention and adapted for use within a charge pump circuit.
Figure 9A:
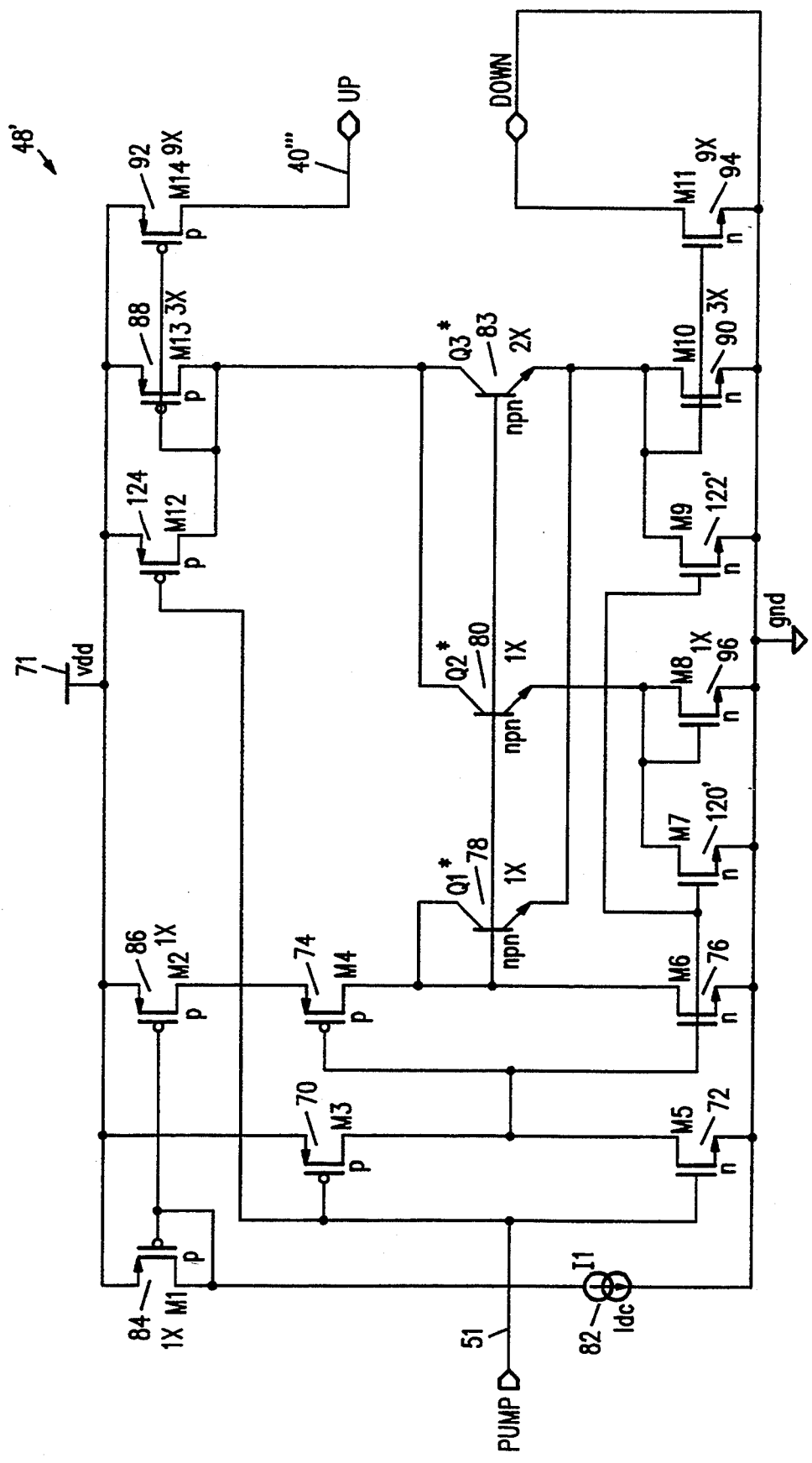
FIGS. 9(A-B) are electrical schematic diagrams respectively illustrating the circuit of FIG. 9 in a current source and current sink configuration.
Figure 9B:
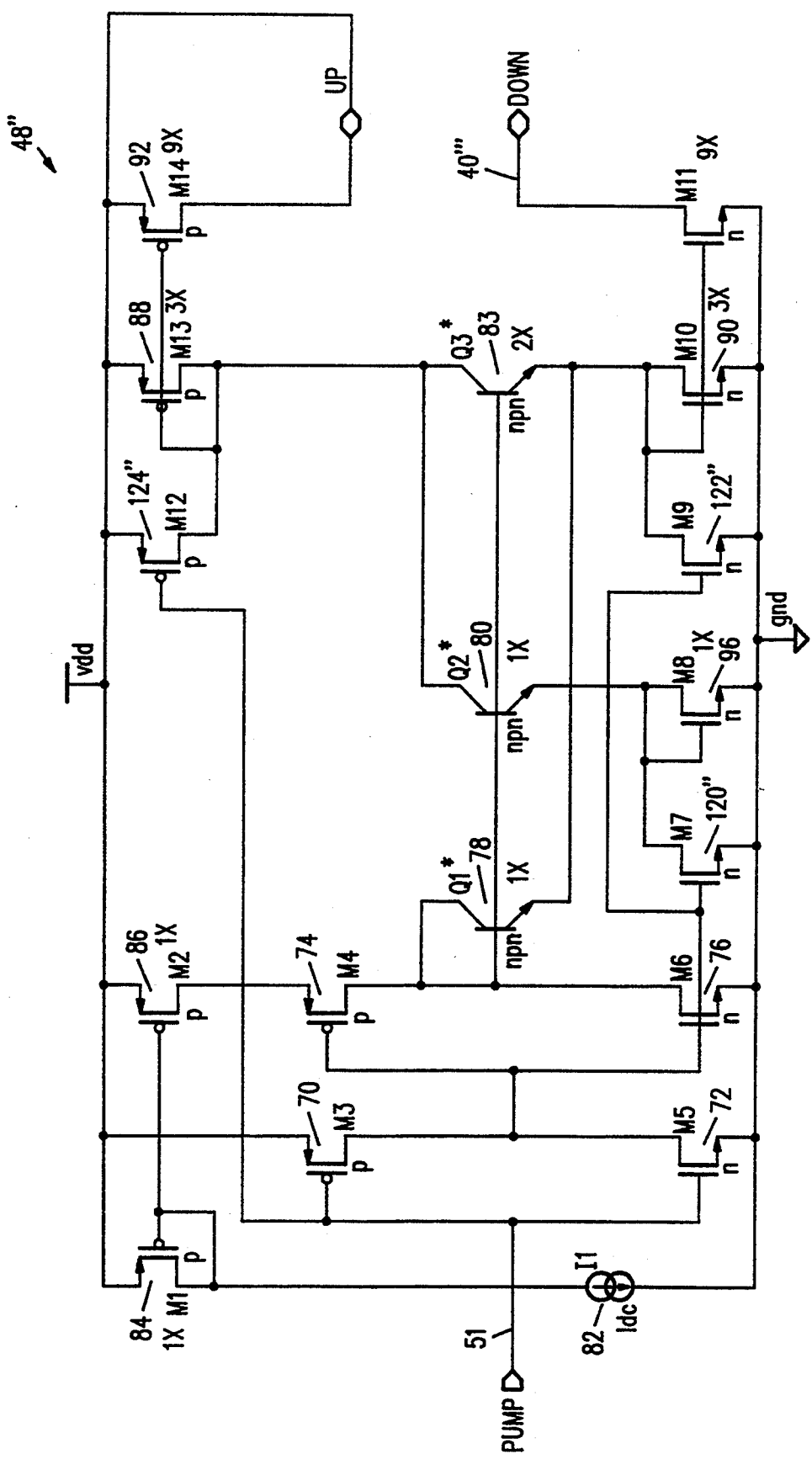

In a third embodiment of this invention, illustrated by circuit 48 in FIG. 8, resistors 98, 100, and 102 of circuit 46 are respectively replaced by NMOS transistors 120 and 122 and by PMOS transistor 124. Therefore, circuit 48 is substantially similar to circuit 46 with the exception of these replacement elements 120, 122, and 122. Moreover, as shown by circuits 48' and 48" in FIGS. 9(A-B), the source and sink configuration of circuit 48 are respectively and substantially identical to the source and sink configurations of circuit 46 except for use of these replacement elements.

Upon receipt of a logically high activation signal 51, transistors 72 and 74 become activated and transistors 70 and 76 become deactivated in the manner previously described with respect to circuit 46. Such transistor activation causes current, from source 82, to flow through transistors 84 and 86, thereby activating transistors 78, 80 and 83.

The logically high signal 51 also causes transistors 120, 122, and 124 to be deactivated thereby allowing current to flow through transistors 88 and 92 and to be sourced onto bus 40'''. Activation of transistors 120, 122, and 124 also allows current to be selectively received by transistor 94 in the previously described sink configuration.

A logically low signal 51 activates transistors 120, 122, and 124, thereby discharging existing potential between respective gate to drain terminals of transistors 96 and 90 to ground 101 and causing the drain to gate terminal potential of transistor 88 to have a value corresponding to the value of source 71. In this manner, no current may be absorbed from or output to the conventional loop filter.

Circuit 48 is preferred over circuit 46 since the use of transistors 120, 122, and 124 prevents resistor intolerance from varying or modifying sourced or absorbed current, and provides for a more efficient generation or sinkage of current. As before, it should be realized that transistors 92 and 94 may be scaled, as desired, relative to transistors 88 and 90 in order to sink or source various amounts of current.

Figure 10:
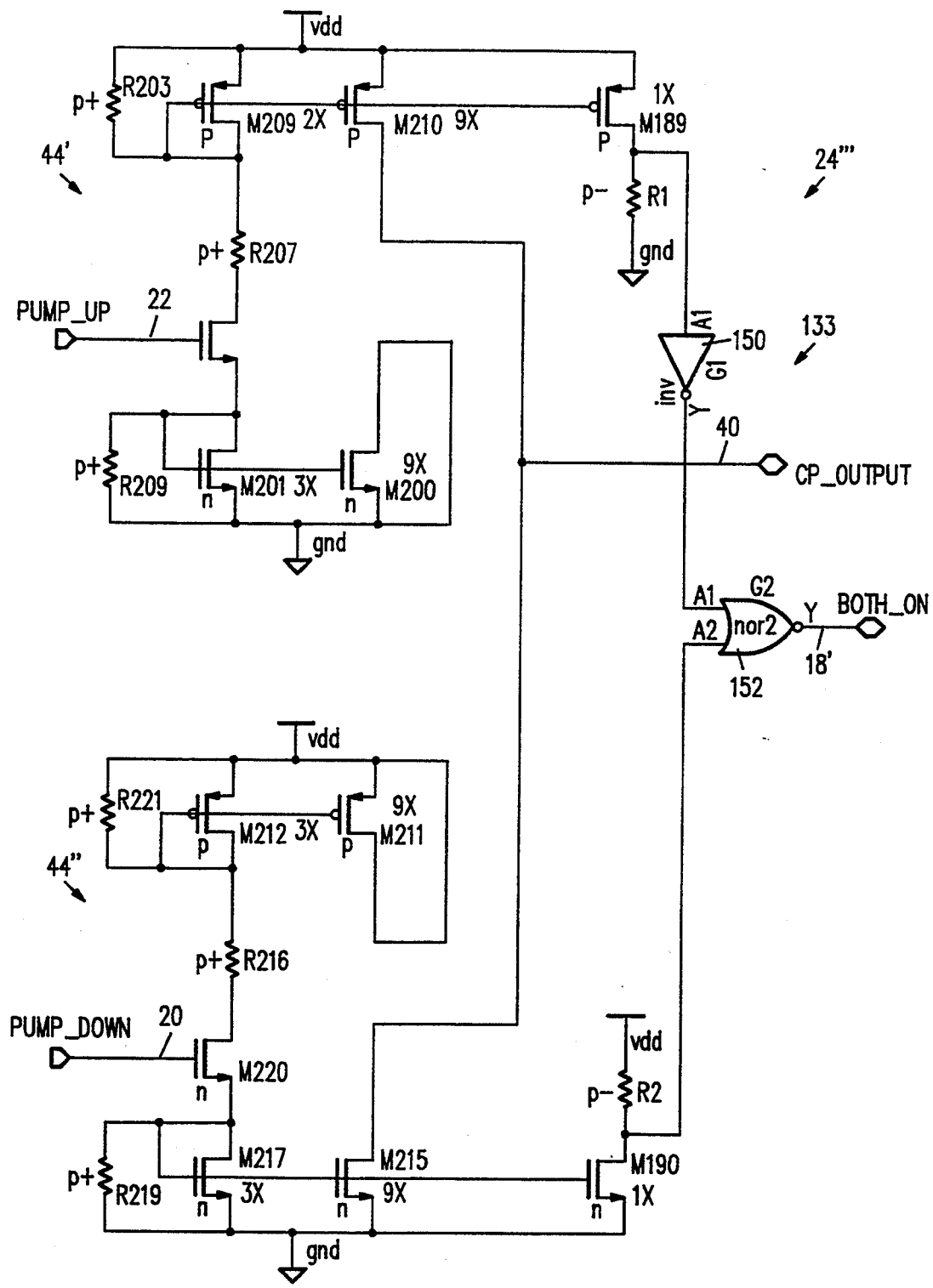
FIG. 10 is an electrical schematic diagram of a charge pump circuit including the circuits shown in FIGS. 5(A-B) and having a feedback circuit which senses the concomitant sinking and sourcing of current.

Referring now to FIG. 10, there is shown a charge pump circuit 24''' including circuits 44' and 44". The operation of each of these circuits has previously been discussed. However, circuit 24''' also includes a feedback signal generator and output signal sensor 133 which provides a signal 18' to the voltage controlled oscillator (such as that shown in FIG. 1) upon a concomitant source and sinking operation.

As shown, generator 133 includes an inverter 150 having its input coupled to the drain terminal of transistor 64 and a NOR gate 152 having a first input coupled to the drain terminal of transistor 56. The output of inverter 150 is coupled as a second input to gate 152.

When circuit 24" concomitantly sinks and sources current relative to the loop filter, both signals input to gate 152 are logically low. Gate 152 outputs a logically high signal 154, indicating such a concomitant sourcing and sinking. Signal 18' will be logically at all times unless current is both sunk and sourced.

Figure 7B:
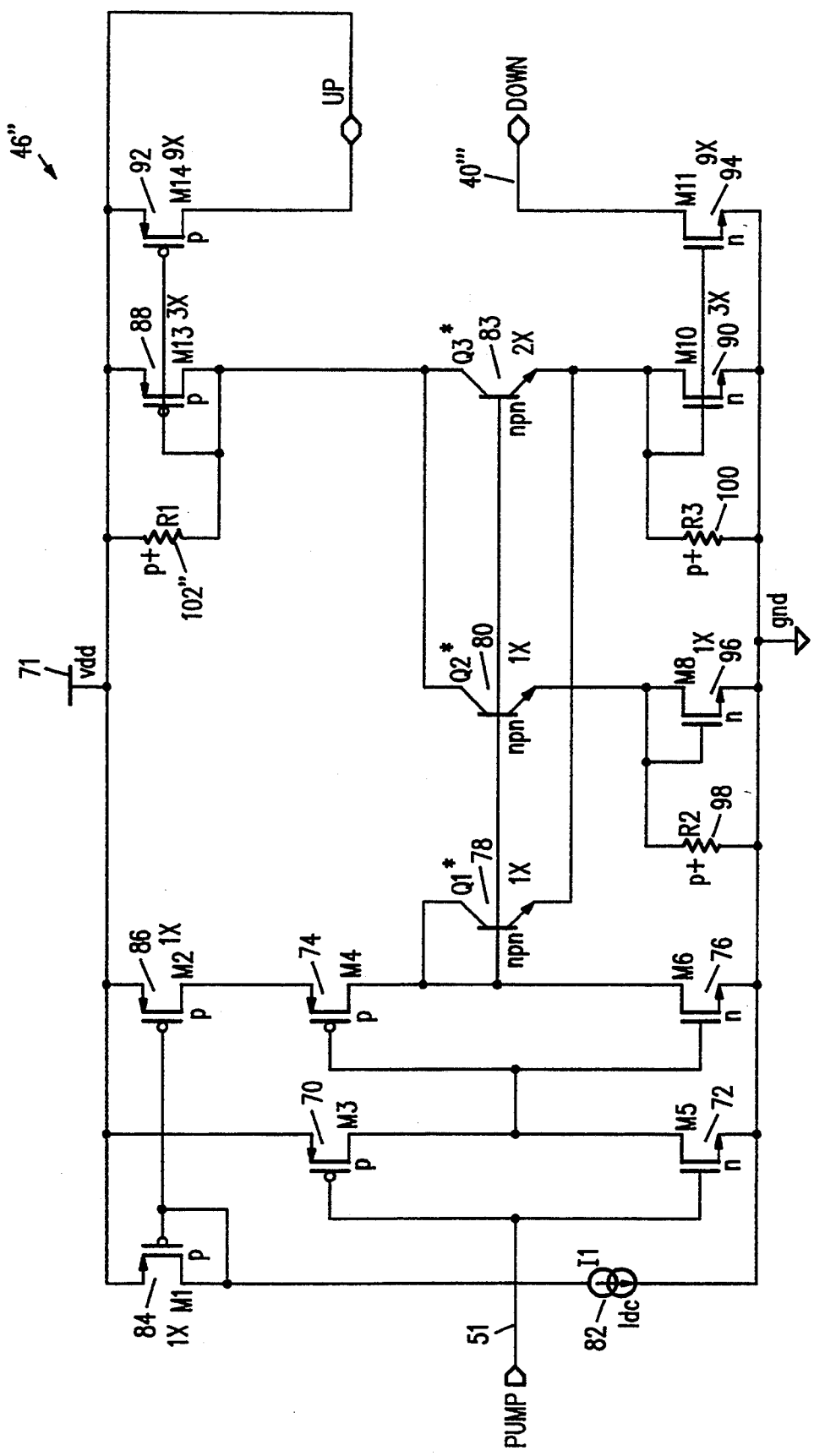
Figure 11:
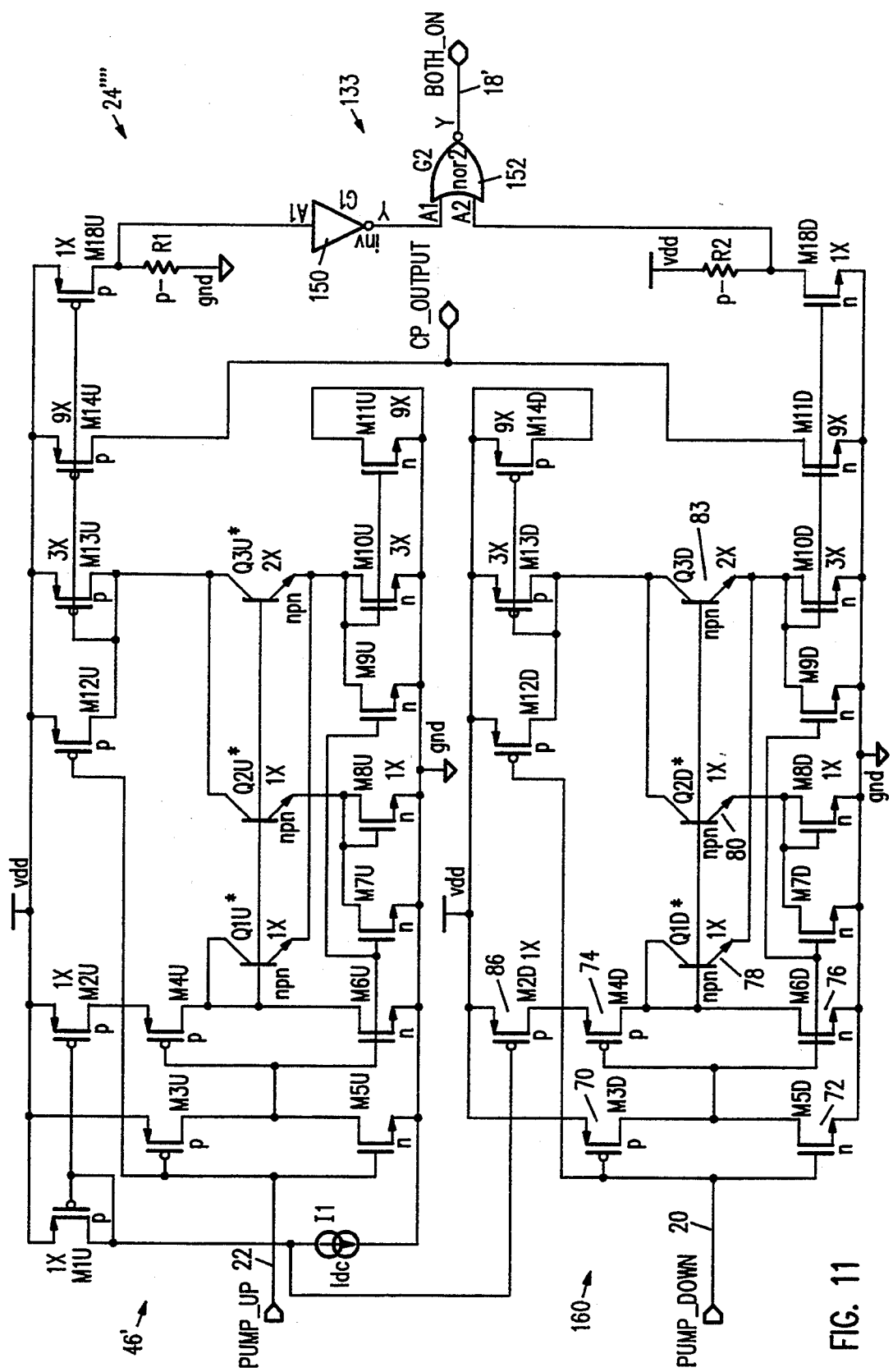
FIG. 11 is an electrical schematic diagram of a charge pump circuit including the circuit shown in FIG. 9(A) and a modified version of the circuit shown in FIG. 9(B).

Referring now to FIG. 11, there is shown a charge pump circuit 24'''' including a first circuit 46' (see FIG. 7(A)), a second circuit 160 which is similar to circuit 46" shown in FIG. 7(B), and a sensor 133 which has been discussed.

As earlier stated, circuits 46' and 46" may be used in a single charge pump embodiment. In order to eliminate a redundant current source and transistor, a charge pump circuit arrangement may be constructed as shown in FIG. 11.

Specifically, circuit 46' sources current in a manner which has previously been described. In current sink operation, a logically high signal 20 activates transistors 72 and 74 and deactivates transistors 70 and 76. In this manner, current from source 82, which is coupled to transistor 86 is coupled to transistors 78, 80, and 83 in a manner previously described with reference to circuit 48" of FIG. 9(B). When signal 20 becomes logically low and deactivates transistors 72 and 74 while activating transistors 70 and 76, current is prevented from flowing through transistors 78, 80, and 83, thereby preventing current from being sunk. In this manner, circuit 160 acts as a charge pump circuit and has excellent current sinking and sourcing matching since only a single source 82 is utilized for both the current source and sink circuits.

It is to be understood that the invention is not limited to the exact construction or method illustrated and described above, but that various changes and modifications may be made without departing from the spirit and scope of the invention as defined in the following claims. Moreover, it should be realized that any of the transistors employed by any of the various circuits 44, 46, and 48 of this invention may be replaced with other and equivalent transistor types.

We claim:

1. A current sourcing and sinking circuit for sourcing and sinking selected output currents, comprising:

first current sourcing/sinking means for receiving a first control signal and in accordance therewith providing a first output current, and including a first current sourcing/sinking circuit topology with first current source means for providing said first output current and first current sink means for selectively sinking a second output current, wherein said first current source and sink means are isolated from one another;

second current sourcing/sinking means for receiving a second control signal and in accordance therewith sinking a third output current, and including a second current sourcing/sinking circuit topology with second current sink means for sinking said third output current and second current source means for selectively providing a fourth output current, wherein said second current sink and source means are isolated from one another; and a circuit node connecting said first current source means and said second current sink means for receiving said first output current therefrom and providing said third output current thereto, respectively;

wherein said first and second current sourcing/sinking circuit topologies are substantially similar.

2. A current sourcing and sinking circuit as recited in claim 1, wherein said first and second current source circuits have first and second current source circuit topologies, respectively, which are substantially similar.

3. A current sourcing and sinking circuit as recited in claim 1, wherein said first and second current sink circuits have first and second current sink circuit topologies, respectively, which are substantially similar.

4. A current sourcing and sinking circuit as recited in claim 1, wherein said first current sink means includes a transistor with two mutually shorted output terminals.

5. A current sourcing and sinking circuit as recited in claim 1, wherein said second current source means includes a transistor with two mutually shorted output terminals.

6. A current sourcing and sinking circuit as recited in claim 1 wherein a first delay time comprises a first time interval beginning with said reception of said first control signal and ending with said providing of said first output current, a second delay time comprises a second time interval beginning with said reception of said second control signal and ending with said sinking of said third output current, and said first and second delay times are substantially equal.

7. A method of providing a current sourcing and sinking circuit for sourcing and sinking selected output currents, comprising:

providing a first current sourcing/sinking circuit which is for receiving a first control signal and in accordance therewith providing a first output current, and which includes a first current sourcing/sinking circuit topology with a first current source circuit for providing said first output current and a first current sink circuit adapted to selectively sink a second output current, wherein said first current source and sink circuits are isolated from one another;

providing a second current sourcing/sinking circuit which is for receiving a second control signal and in accordance therewith sinking a third output current, and which includes a second current sourcing/sinking circuit topolyogy with a second current sink circuit for sinking said third output current and a second current source circuit adapted to selectively provide a fourth output current, wherein said second current sink and source are isolated from one another; and providing a circuit node connecting said first current source circuit and said second current sink circuit which is for receiving said first output current therefrom and providing said third output current thereto, respectively;

wherein said first and second current sourcing/sinking circuit topologies are substantially similar.

8. A current sourcing and sinking circuit as recited in claim 7, wherein said first and second current source circuits have first and second current source circuit topologies, respectively, which are substantially similar.

9. A current sourcing and sinking circuit as recited in claim 7, wherein said first and second current sink circuits have first and second current sink circuit topologies, respectively, which are substantially similar.

10. A current sourcing and sinking circuit as recited in claim 7, wherein said first current sink circuit includes a transistor with two mutually shorted output terminals.

11. A current sourcing and sinking circuit as recited in claim 7, wherein said second current source circuit includes a transistor with two mutually shorted output terminals.

12. A current sourcing and sinking circuit as recited in claim 7, wherein a first delay time comprises a first time interval beginning with said reception of said first control signal and ending with said providing of said first output current, a second delay time comprises a second time interval beginning with said reception of said second control signal and ending with said sinking of said third output current, and said first and second delay times are substantially equal.

13. A current sourcing and sinking method for sourcing and sinking selected output currents, comprising the steps of:

receiving a first control signal and in accordance therewith outputting a first output current with a first current sourcing/sinking circuit which includes a first current sourcing/sinking circuit topology with a first current source circuit which provides said first output current and a first current sink circuit adapted to selectively sink a second output current, wherein said first current source and sink circuits are isolated from one another;

receiving a second control signal and in accordance therewith sinking a third output current with a second current sourcing/sinking circuit which includes a second current sourcing/sinking circuit topology with a second current sink circuit which sinks said third output current and a second current source circuit adapted to selectively provide a fourth output current, wherein said second current sink and source circuits are isolated from one another; and connecting said first current source circuit and said second current sink circuit with a circuit node which receives said first output current therefrom and provides said third output current thereto, respectively;

wherein said first and second current sourcing/sinking circuit topologies are substantially similar.

14. A current sourcing and sinking method as recited in claim 13, wherein said first and second current source circuits have first and second current source circuit topologies, respectively, which are substantially similar.

15. A current sourcing and sinking circuit as recited in claim 13, wherein said first and second current sink circuits have first and second current sink circuit topologies, respectively, which are substantially similar.

16. A current sourcing and sinking circuit as recited in claim 13, wherein said first current sink circuit includes a transistor with two mutually shorted output terminals.

17. A current sourcing and sinking circuit as recited in claim 13, wherein said second current source circuit includes a transistor with two mutually shorted output terminals.

18. A current sourcing and sinking circuit as recited in claim 13, wherein said step of receiving a first control signal and in accordance therewith outputting a first output current comprises outputting said first output current a first delay time after said reception of said first control signal, said step of receiving a second control signal and in accordance therewith sinking a third output current comprises sinking said third output current a second delay time after said reception of said second control signal, and wherein said first and second delay times are substantially equal.

* * * * *

UNITED STATES PATENT AND TRADEMARK OFFICE
CERTIFICATE OF CORRECTION

PATENT NO. : 5,357,216
DATED : October 18, 1994
INVENTOR(S) : Thai M. Nguyen

It is certified that error appears in the above-indentified patent and that said Letters Patent is hereby corrected as shown below:

IN THE CLAIMS:

In Col. 9, line 47, please delete "circuits" and replace with --means--.

In Col. 9, lines 50 and 51, please delete "circuits" and replace with --means--.

Signed and Sealed this

Twentieth Day of December, 1994

Attest:

BRUCE LEHMAN

Attesting Officer     Commissioner of Patents and Trademarks